(12) United States Patent
Venkateswaran (10) Patent No.: US 7,135,765 B2
(45) Date of Patent: Nov. 14, 2006

(54) SEMICONDUCTOR DEVICE PACKAGE AND METHOD OF MAKING THE SAME

(75) Inventor: Muthiah Venkateswaran, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 186 days.

(21) Appl. No.: 10/789,646

(22) Filed: Mar. 1, 2004

(65) Prior Publication Data

US 2004/0164414 A1    Aug. 26, 2004

Related U.S. Application Data

(62) Division of application No. 10/167,894, filed on Jun. 12, 2002, now Pat. No. 6,780,673.

(51) Int. Cl.
*H01L 23/31* (2006.01)
(52) U.S. Cl. .................................................. 257/698
(58) Field of Classification Search ................ 257/691, 257/698, 700, 730, 779, 786
See application file for complete search history.

(56) References Cited

U.S. PATENT DOCUMENTS

| | | | |
|---|---|---|---|
| 6,261,883 B1 | 7/2001 | Koubuchi et al. | 438/197 |
| 6,274,391 B1 | 8/2001 | Wachtler et al. | 438/6 |
| 6,312,974 B1 * | 11/2001 | Wu et al. | 438/107 |
| 6,388,207 B1 * | 5/2002 | Figueroa et al. | 174/262 |
| 6,521,530 B1 | 2/2003 | Peters et al. | 438/667 |
| 6,800,947 B1 * | 10/2004 | Sathe | 257/780 |
| 6,828,669 B1 * | 12/2004 | Iijima et al. | 257/700 |
| 2003/0122213 A1 * | 7/2003 | Hsu et al. | 257/508 |
| 2004/0036179 A1 * | 2/2004 | Chiu et al. | 257/778 |

\* cited by examiner

*Primary Examiner*—Laura M. Schillinger
*Assistant Examiner*—Jennifer M Dolan
(74) *Attorney, Agent, or Firm*—Wade James Brady, III; Frederick J. Telecky, Jr.

(57) ABSTRACT

A semiconductor device package and a method of making the same are provided. The semiconductor device includes a package substrate, a layer of conductive material, a group of channels, and a chip. The package substrate has a top layer. The top layer has a group of conductive vias formed therethrough. The conductive material layer is formed on the top layer of the package substrate. The group of channels are formed in the conductive material layer about at least some of the vias to define a group of contact pads on the vias. The chip is electrically coupled to the package substrate through the contact pads.

11 Claims, 8 Drawing Sheets

SEMICONDUCTOR DEVICE PACKAGE AND METHOD OF MAKING THE SAME

This application claims the benefit of U.S. application Ser. No. 10/167,894 filed Jun. 12, 2002, now U.S. Pat. No. 6,780,673.

TECHNICAL FIELD

The present invention relates to a semiconductor device package structure and method of forming contact pads for a packaged semiconductor device.

BACKGROUND

Integrated circuit devices typically include a semiconductor chip that is assembled in a package. Many types of packages exist. One such package configuration is a flip-chip ball grid array.

Figure 1:
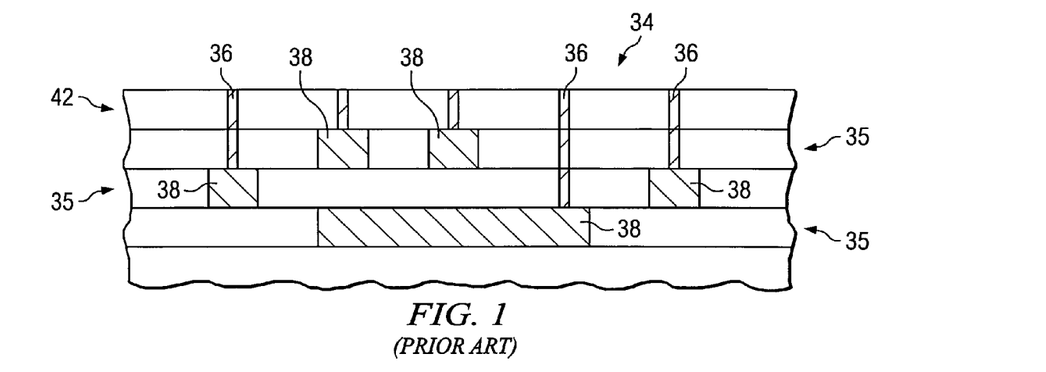
FIG. 1 shows a cross-section view a typical package substrate of a semiconductor device.
Figure 2:
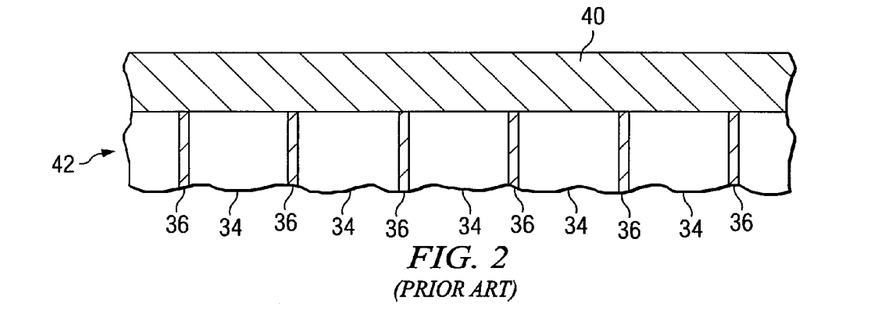
FIG. 2 shows a cross-section view of the package substrate of FIG. 1 with a copper layer added thereon.
Figure 3:
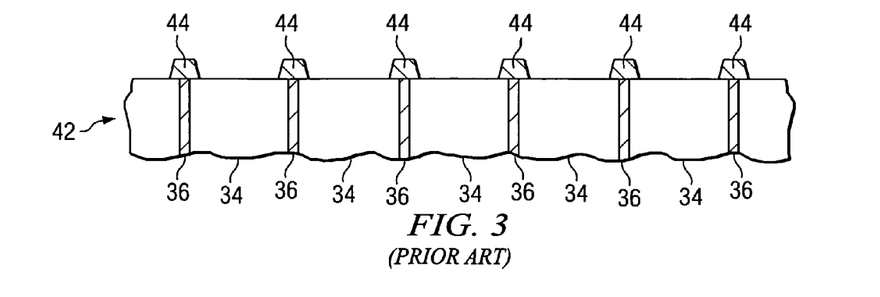
FIG. 3 shows a cross-section view of the package substrate of FIG. 1 with a group of contact pads formed thereon.

FIGS. 1–6 illustrate the steps for forming a typical flip-chip ball grid array for a semiconductor device package. FIG. 1 shows a cross-section view of a package substrate 34 for use in assembling a packaged semiconductor device. Note that the terms "semiconductor device" and "integrated circuit device" may be used interchangeably herein. Note also that the term "chip" may be interchanged with the term "die." The package substrate 34 has multiple layers 35 laminated together with vias 36 and traces 38 routed therethrough. The layers 35 of the package substrate 34 may be made from organic materials and/or fiberglass, for example. In FIG. 2, a layer of copper 40 is formed on the top layer 42 of the package substrate 34. FIG. 3 shows a group of copper contact pads 44 formed from the copper layer 40. Between FIGS. 2 and 3 are conventional process steps not shown, which may include: applying a resist layer, exposing the resist layer through a mask, developing the resist layer, forming a pattern in the resist from the mask image, etching the copper layer in the pattern formed in the resist, and striping the remaining resist. One of ordinary skill in the art will be familiar with the conventional process steps to get from FIG. 2 to FIG. 3.

Figure 4:
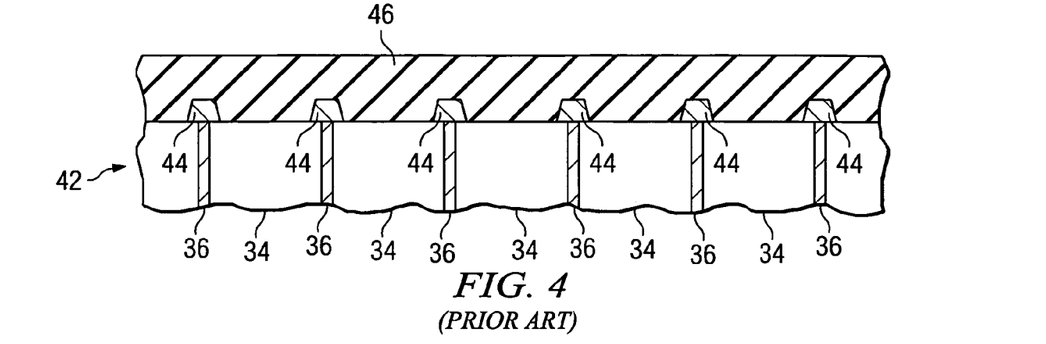
FIG. 4 shows a cross-section view of the package substrate of FIG. 3 with an organic material layer formed thereon.
Figure 5:
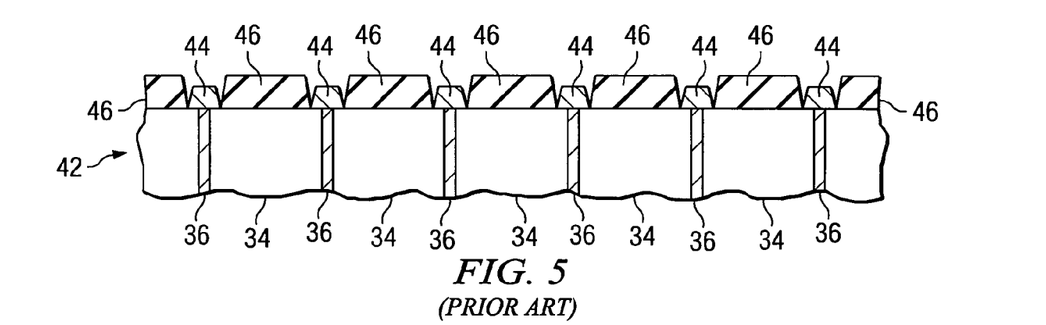
FIG. 5 shows a cross-section view of the package substrate of FIG. 3 with a solder mask formed thereon.
Figure 6:
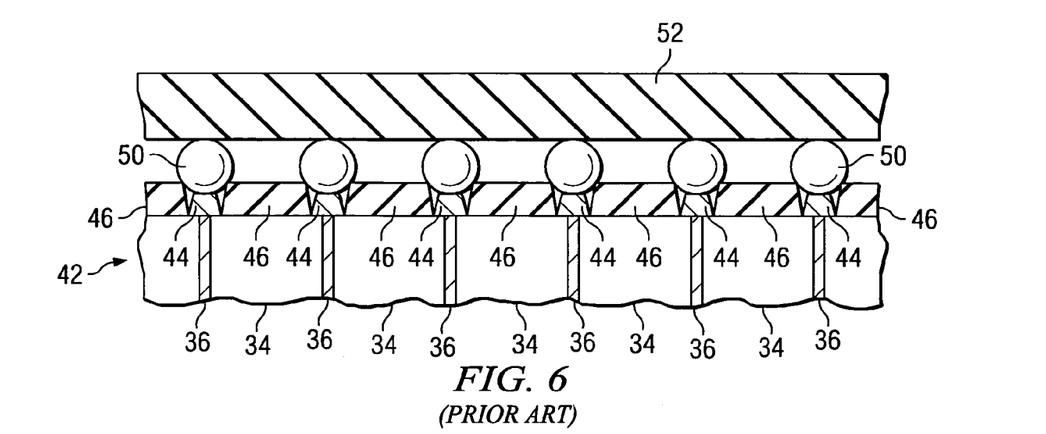
FIG. 6 shows a cross-section view of the package substrate of FIG. 5 with a chip and solder balls soldered on the contact pads.

In FIG. 4, a layer of organic material 46 is applied on the top layer 42 of the package substrate over the contact pads 44. FIG. 5 shows a solder mask 46 formed from the organic material layer. Between FIGS. 4 and 5 are conventional process steps not shown, as discussed above, which one of ordinary skill in the art will be familiar with. The solder mask 46 is typically at least about 5–30 microns taller than the contact pads 44. In FIG. 6, a chip 52 having solder balls 50 deposited thereon is mated with the contact pads 44 and the solder balls 50 are soldered (e.g., by reflowing the solder) to the contact pads 44. The solder mask 46 is intended to prevent solder of the solder balls 50 from bonding to the top layer 42 of the package substrate 34 and/or flowing across to an adjacent solder ball 50.

Figure 7:
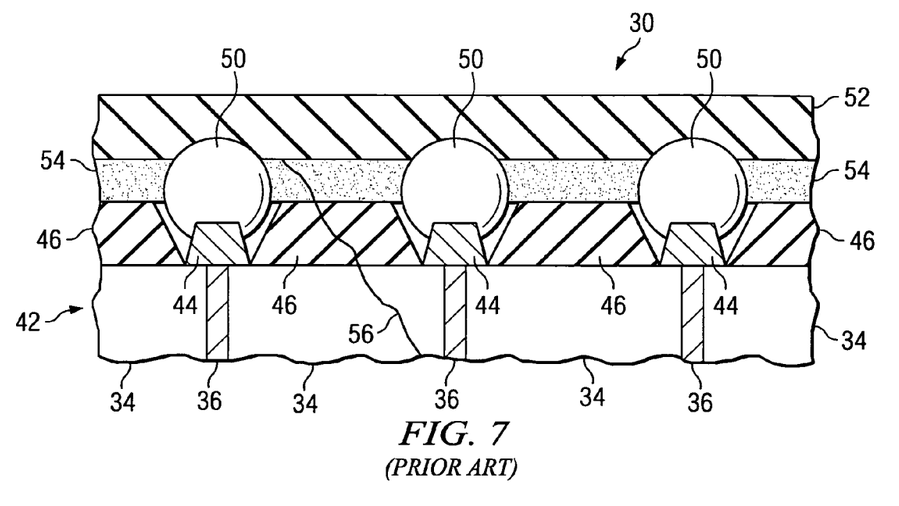
FIG. 7 shows a cross-section view of the chip attached to the package substrate with underfill material therebetween.

FIG. 7 shows a chip 52 attached to the package substrate 34 via the solder balls 50 to form a packaged integrated circuit device 30. After the chip 52 is attached to the package substrate 34, an underfill material 54 is injected into the space between the chip 52 and the package substrate 34, as well as between and around the solder balls 50. After the underfill material 54 is injected as a liquid, it is then cured to form a solid layer. One of the purposes of the underfill layer 54 is form a composite of the chip 52 and package substrate 34, to mechanically couple the chip 52 to the package substrate 34, and to relieve stresses that would otherwise be exerted on the solder balls 50. The difference in the thermal expansion rates for the chip 52 and the package substrate 34 are often quite different, which may cause stress on the solder joints at the solder balls 50 as temperatures vary. Hence, some of the thermal stress can be transferred to the underfill layer 54 to relieve stress on solder joints and solder balls 50. The underfill material 54 may be epoxy, anhydride, a silicon compound, or any combination thereof, for example.

Due at least in part to the process of forming the underfill layer 54 and/or due to gas bubbles in the underfill layer 54, the underfill layer 54 typically has voids or cavities formed therein. Such voids or cavities are sources of stress concentration and may lead to the development of a crack in the underfill layer 54. The underfill material 54 is usually more brittle than that of the solder balls 50. When a crack initiates, the crack creates another location for stress concentration to arise and the crack will often have a tendency to propagate until the stress concentration is relieved. A crack 56 is shown in FIG. 7 to illustrate an example of how a crack 56 initiated in the underfill layer 54 may propagate through the solder mask 46 and into the package substrate 34. In the case of FIG. 7, the crack 56 has propagated through a via 36, which may cause an "open" or an electrical discontinuity at the via 36. With the current structure shown in FIG. 7, a crack 56 that develops in the underfill layer 54 will often propagate through the solder mask 46 and into the package substrate 34 because the solder mask 46 and the package substrate 34 are typically made from similar materials, such as organic materials for example, and/or they have similar material properties. Hence, there is a need for an improved structure for a package substrate 34 that can reduce or hinder the propagation of cracks 56 initiated in the underfill layer 54.

BRIEF SUMMARY OF THE INVENTION

The problems and needs outlined above are addressed by certain aspects of the present invention. In accordance with one aspect of the present invention, a method of forming a package for an integrated circuit device is provided. The method includes the following steps, the order of which may vary: contact pads are formed on a top layer of a package substrate and a plate layer is formed on the top layer of the package substrate. The plate layer is located in an area outside of the contact pads, and the plate layer has a thickness about equal to a thickness of the contact pads.

In accordance with another aspect of the present invention, a method of forming a package for an integrated circuit device is provided. This method includes the following steps, the order of which may vary: a layer of conductive material is formed on a top layer of a package substrate, and a portion of the conductive material layer is removed to form channels. Each channel defines a corresponding contact pad surrounded by the channel. Each contact pad is formed from the conductive material layer. Each channel is surrounded by a remaining portion of the conductive material layer outside of the channel. An oxide layer, for example, may be formed over the contact pads, the channels, and the remaining portion of the conductive material layer, and portions of the oxide layer may be removed from the contact pads to expose the contact pads. Solder balls may be deposited on each of at least some of the contact pads, and the oxide layer may hinder the solder balls from bonding to the remaining portion of the conductive material layer surrounding the channels with the oxide layer. In alternative, an organic material layer may be used, for example, instead of or in addition to an oxide layer. A chip may be soldered to the solder balls, such that the solder balls are sandwiched between the chip and the substrate, and such that the contact pads are electrically coupled to the chip via the solder balls. An underfill material may be injected between the package substrate and the chip, as well as substantially around the solder balls. When cured, the underfill material may form an underfill material layer between the chip and the package substrate with the solder balls embedded therein.

In accordance with yet another aspect of the present invention, a semiconductor device is provided, which includes a package substrate, a layer of conductive material, a group of channels, and a chip. The package substrate has a top layer. The top layer has a group of conductive vias formed therethrough. The layer of conductive material is formed on the top layer of the package substrate. The group of channels are formed in the conductive material layer about at least some of the vias to define a group of contact pads on the vias. The chip is electrically coupled to the package substrate through the contact pads.

BRIEF DESCRIPTION OF THE DRAWINGS

The above features of the present invention will be more clearly understood from consideration of the following descriptions in connection with accompanying drawings in which.

DETAILED DESCRIPTION OF PREFERRED EMBODIMENTS

Referring now to the drawings, wherein like reference numbers are used herein to designate like elements throughout the various views, preferred embodiments of the present invention are illustrated and described. As will be understood by one of ordinary skill in the art, the figures are not necessarily drawn to scale, and in some instances the drawings have been exaggerated and/or simplified in places for illustrative purposes only. One of ordinary skill in the art will appreciate the many applications and variations of the present invention in light of the following description of the preferred embodiments of the present invention. The preferred embodiments discussed herein are illustrative examples of the present invention and do not limit the scope of the invention to the preferred embodiments described.

Generally, an embodiment of the present invention provides an improved semiconductor device package being less prone to cracks propagating from the underfill layer into the package substrate. A first embodiment of the present invention is shown in FIGS. 8–11. FIGS. 1 and 2 are also used in describing the first embodiment. First, the process of developing an improved package structure for a semiconductor device 30 in accordance with the first embodiment is shown and described. Referring again to FIGS. 1 and 2, the process may begin with a conventional laminate package substrate 34 having vias 36 and traces 38 routed therethrough, as shown in FIG. 1. For an embodiment of the present invention, there are preferably no traces 38 exposed and extending along the top surface 42 of the package substrate 34 (see FIG. 1). In other words, preferably only vias 36 where contact pads 44 will be formed are exposed at the top layer 42. However, it is also still possible to implement the present invention in a case where traces 38 are exposed on the top layer 42, but steps may be needed to preventing shorting (e.g., adding a dielectric layer or barrier). In FIG. 2, a conductive layer 40 is formed on the top layer 42 of the package substrate 34.

The conductive layer 40 may be formed from a variety of materials, including but not limited to: copper, aluminum, titanium, nickel, gold, silver, or any combination thereof, for example. Preferably, the conductive layer 40 has a high strength and good ductility relative to the underfill layer 54 and the package substrate 34. Also, the conductive layer 40 preferably has structural rigidity and strength better than that of a conventional solder mask 46 made from organic material (e.g., see FIGS. 5–7). Because the contact pads 44 typically will be made from a metal, such as copper or aluminum, the conductive layer 40 will thus typically have these preferable characteristics, which are inherent in most metals used for contact pads 44.

Figure 8:
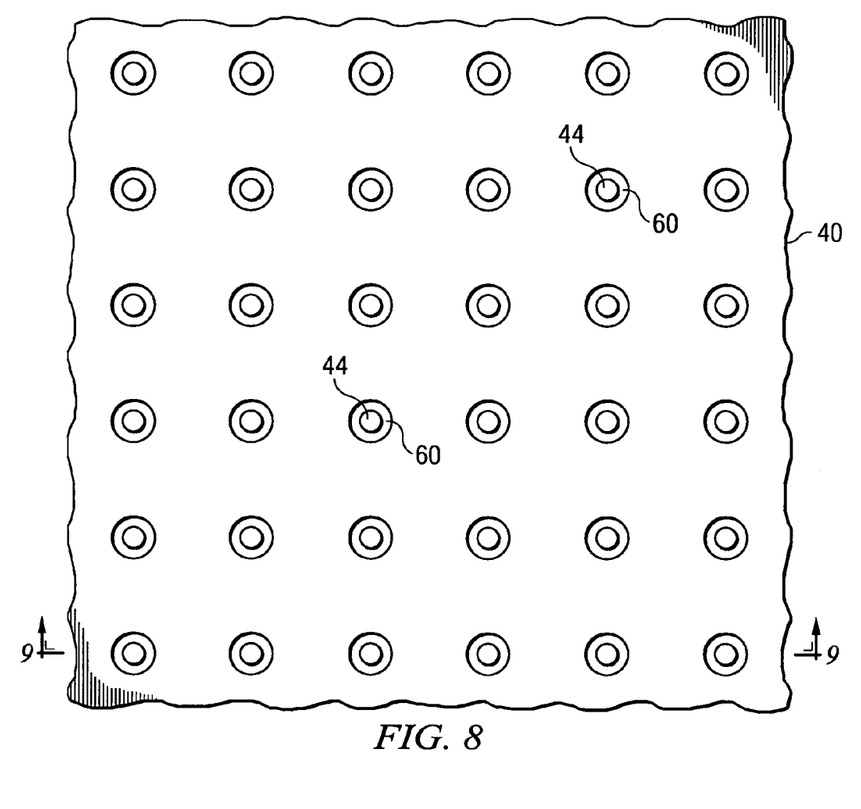
FIG. 8 shows a top view of a package substrate of a first embodiment of the present invention.
Figure 9:
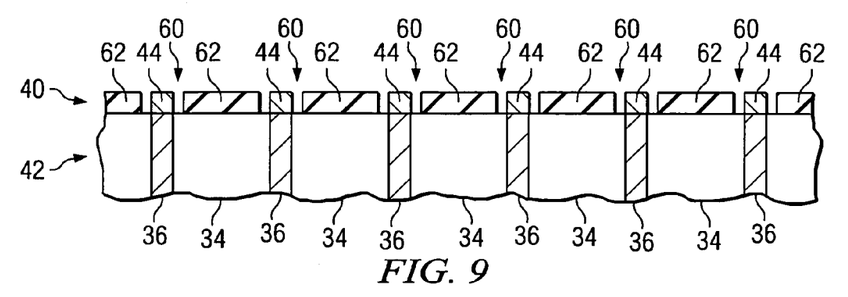
FIG. 9 shows a cross-section view of the package substrate of FIG. 8 taken along line 9—9.

As shown in FIGS. 8 and 9, portions of the conductive layer 40 are removed to form a group of channels 60 defining a corresponding group of contact pads 44 over the vias 36. FIG. 8 is a top view of the package substrate 34 with the contact pads 44 formed thereon. The remaining portions of the conductive layer 40 are left in place to form a plate-like structure 62 surrounding the contact pads 44. FIG. 9 is a cross-section view of the package substrate 34 shown in FIG. 8 taken along line 9-9.

In an alternate embodiment (not shown), the plate structure 62 of the conductive layer 40 may serve as a ground plane. In such an embodiment, any pad or pads 44 may that are coupled to ground portions of the circuit may be electrically coupled to the plate structure 62. In other words, for certain pads 44 the channel 60 may be eliminated. Alternatively, a power plane, e.g., VDD, may be formed by the plate structure 62 of the conductive layer 40, and for certain pads 44 the channel 60 may be eliminated for locations corresponding to a pad on the chip 52 that is to be electrically coupled to the power plane.

Figure 10:
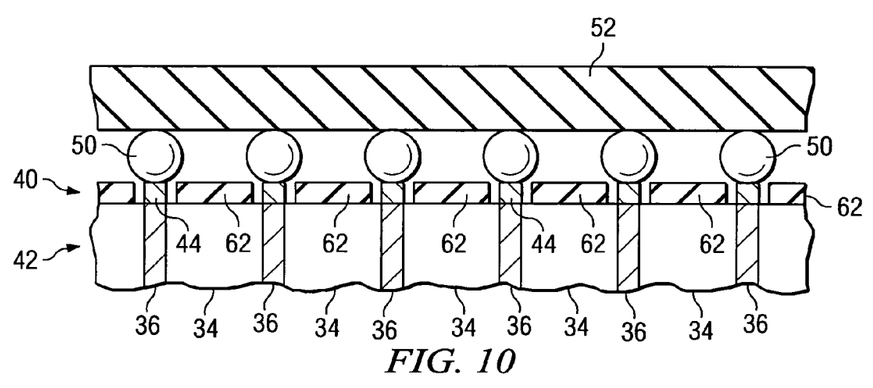
FIG. 10 shows a cross-section view of the package substrate of FIGS. 8 and 9 with solder balls soldered on the contact pads to connect a chip.
Figure 11:
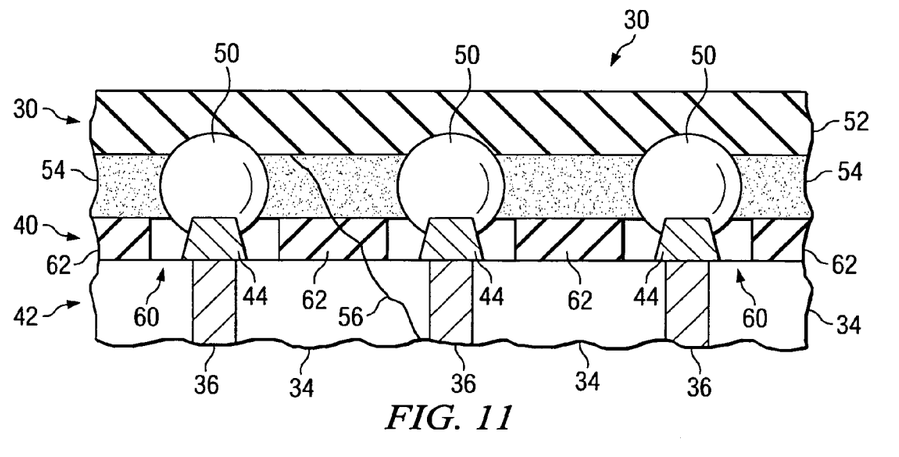
FIG. 11 shows a cross-section view of the chip attached to the package substrate with underfill material therebetween.

In FIG. 10, a chip 52 with solder balls 50 deposited thereon is mated with the contact pads 44 and attached using the solder balls 50. FIG. 11 also shows the chip 52 attached or soldered to the package substrate 34 of FIG. 10 with the solder balls 50. After the chip 52 has been attached to the package substrate 34 via the solder balls 50, an underfill material 54 (in liquid form) is injected between the chip 52 and the package substrate 34, as well as substantially around the solder balls 50. Then, the underfill material 54 is cured to form the underfill layer 54. Hence in the resulting structure shown in FIG. 11, the underfill layer 54 with the solder balls 50 embedded therein is sandwiched between the chip 52 and the package substrate 34 to form a composite unit for the semiconductor device 30.

Comparing FIG. 7 and FIG. 11, note that the underfill layer 54 in FIG. 11 is thicker than the underfill layer 54 in FIG. 7. In other words, assuming the distance between the package substrate 34 and the chip 52 is the same in FIGS. 7 and 11, and because the solder mask 46 is typically thicker than the contact pads 44, the device 30 of FIG. 11 has a thicker underfill layer 54 than that of FIG. 7. Usually the solder mask 46 is thicker than the contact pads 44 because it is typically more difficult, impractical, or impossible to form an organic material layer without unwanted open voids exposing the package substrate 34 at the same minimum thickness as a metal layer may be formed without unwanted open voids. A thicker underfill layer 54 allows more stress to be transferred to the underfill layer 54 before underfill layer cracks propagate. On the other hand, the device package 30 of FIG. 11 may be made thinner because there is no solder mask layer 46.

FIG. 11 shows a crack 56 in the underfill layer 54 that initiated in the underfill layer 54. However, when the crack 56 in FIG. 11 reaches the plate structure 62 of the conductive layer 40, the conductive layer 40 is less likely to allow the crack 56 to propagate than the organic material of the solder mask 46 in FIG. 7. This is due to the different mechanical properties of the conductive layer 40 with respect to the underfill layer 54 and the package substrate 34. For example, when the conductive layer 40 is copper, it is more ductile than the organic material of the package substrate 34 and the material of solder mask 46 (organic material) that would be used conventionally. Thus, the conductive layer 40 will hinder crack growth and propagation from the underfill layer 54 into the package substrate 34. Because the conductive layer 40 will usually be a metal (e.g., copper, aluminum), the plate-like structure 62 (see FIG. 8) of the conductive layer 40 will strengthen the composite structure formed by the chip 52, underfill layer 54, solder balls 50, and package substrate 34. Such increased strength for the package substrate 34 is often especially needed as the sized of package substrates 34 and chips 52 increase. Therefore, the improved structure for the semiconductor device 30 shown in FIG. 11 of the first embodiment is an improvement over the prior structure of FIG. 7.

Figure 12:
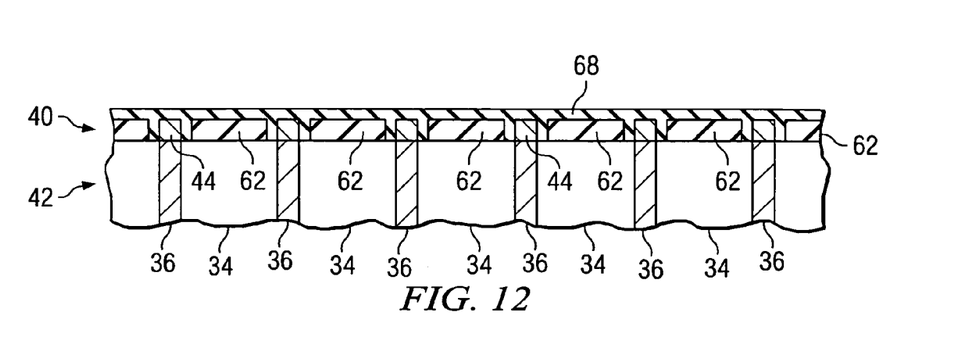
FIG. 12 shows a cross-section view of the package substrate of FIG. 9 with an oxide layer formed thereon.
Figure 13:
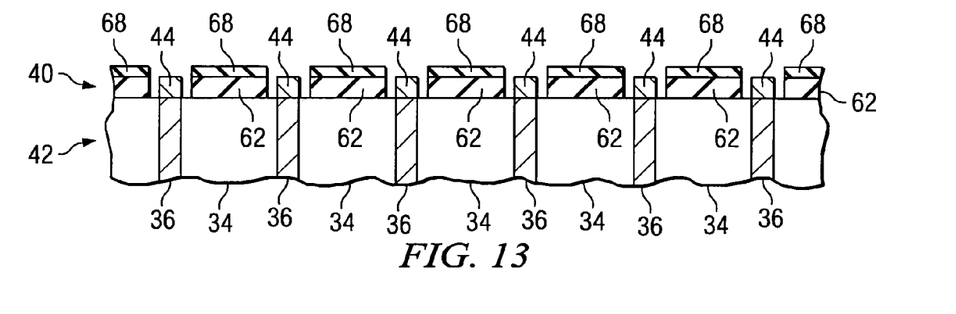
FIG. 13 shows a cross-section view of the package substrate of FIG. 12 with portions of the oxide layer removed above the contact pads, which is a second embodiment of the present invention.
Figure 14:
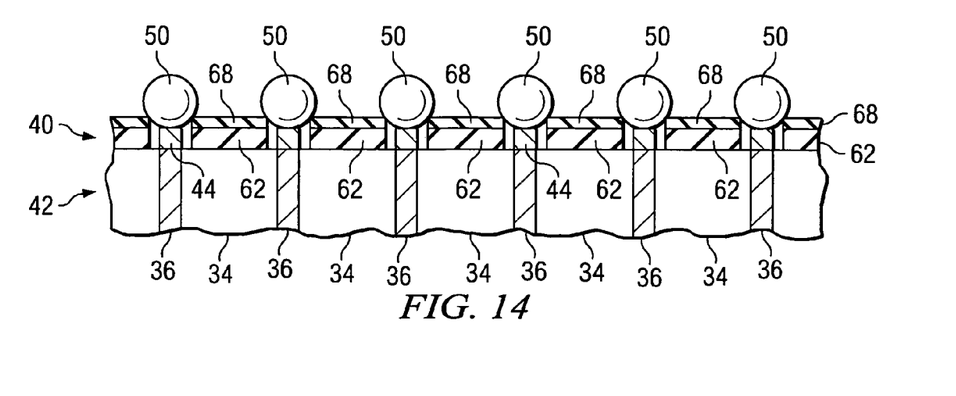
FIG. 14 shows a cross-section view of the package substrate of FIG. 13 with solder balls formed on the contact pads.

As the technology of semiconductor devices progresses, the number of contact pads 44 per square inch on a package substrate 34 tends to increase and the size of each contact pad 44 tends to decrease. Thus depending on how tight the tolerances are for a given group of contact pads 44, it may not be possible in some cases to deposit the solder balls 50 on the contact pads 44 and/or to reflow the solder in the solder balls 50 during attachment of the chip 52 without getting solder on the plate structure 62 (see FIG. 10) surrounding the channels 60. If solder from one or more of the solder balls 50 in FIG. 10 were to flow and stick to the plate structure 62, it may cause random shorts between contact pads 44, which would likely lead to a defective or non-functional semiconductor device 30. A second embodiment of the present invention addresses these issues by adding an insulating layer 68 (e.g., an oxide layer) over the conductive layer 40, except where the contact pads 44 are located, as shown in FIG. 13. The second embodiment may be formed following the same procedure as described above for the first embodiment up to FIG. 9 (i.e., FIGS. 1, 2, and 9). Continuing from FIG. 9, an oxide layer 68 is formed over the conductive layer 40 (i.e., over the plate structure 62, the channels 60, and the contact pads 44) as shown in FIG. 12. Then using conventional processing steps (e.g., resist, mask, develop, etch, strip) as described above, portions of the oxide layer 68 are removed over the contact pads 44 to expose the contact pads 44, as shown in FIG. 13. Then when the solder balls 50 are soldered, as shown in FIG. 14 (chip 52 is not shown attached to solder balls 50), the oxide layer 68 provides a barrier between the solder balls 50 and the plate structure 62 of the conductive layer 40.

Preferably, the oxide layer 68 is much thinner than a conventional solder mask 46 formed from an organic material layer. The oxide layer 68 may be on the order of angstroms (up to a maximum of about 1 micron), whereas a convention solder mask layer 46 is on the order of about 15 microns minimum. Thus, the addition of the oxide layer 68 over the plate structure 62 will not significantly reduce the thickness of the underfill material layer 54 when the chip 52 is attached to the package substrate 34. The oxide layer 68 may be formed from a variety of possible materials, including but not limited to: copper oxide, aluminum oxide, nickel oxide, or another oxide, for example. In practice, the oxide layer 68 will likely depend on or will likely be formed from the material of the conductive layer 40. For example, if copper is used to form the conductive layer 40, it would be efficient and relatively convenient to use copper oxide for the oxide layer 68. However, in some cases nickel and/or gold is plated over copper pads 44 to prevent premature oxidation of the pads 44 because copper tends to oxidize much faster than nickel or gold. In such cases, the oxide layer 68 may be developed from the nickel to form nickel oxide, which is preferably over copper oxide. With the benefit of this disclosure, one of ordinary skill in the art will realize many other possible variations and combinations for the materials used to provide the structure and functions of an embodiment of the present invention.

Figure 15:
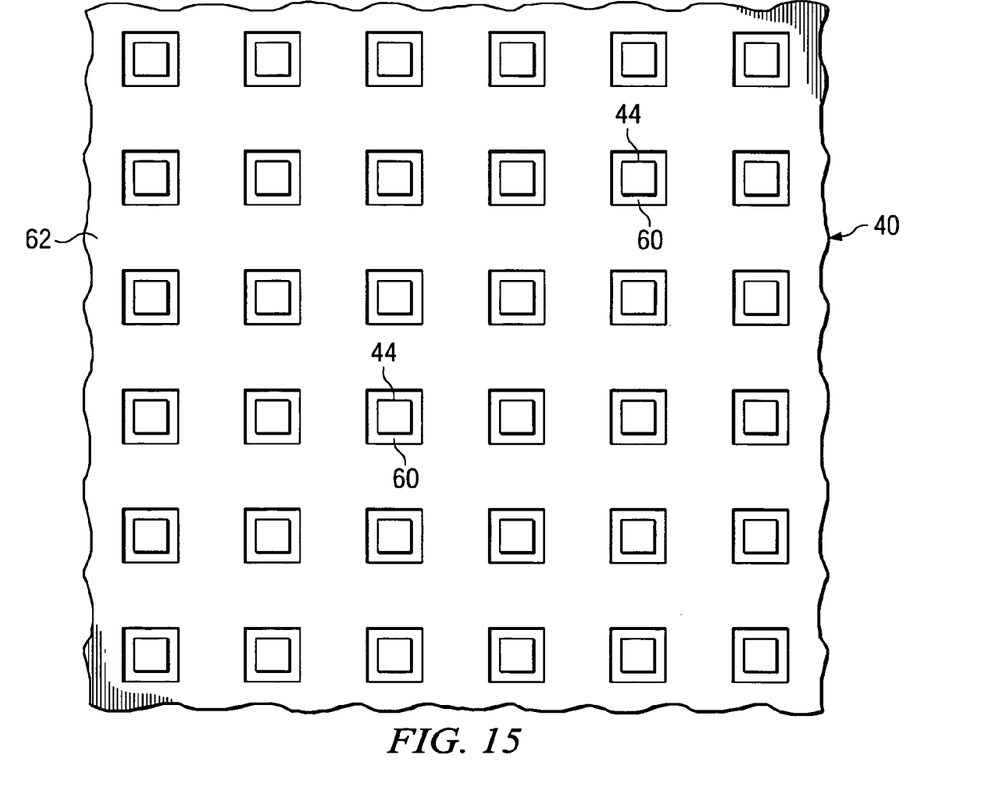
FIG. 15 shows a top view of a package substrate of a third embodiment of the present invention.

Although the contact pads 44 shown for the first embodiment (see FIG. 8) are round, the contact pads 44 may have any shape in other embodiments. FIG. 15 is a top view of a third embodiment of the present invention, which is a variation on the first embodiment. In the third embodiment, the contact pads 44 are rectangular shaped.

Figure 16:
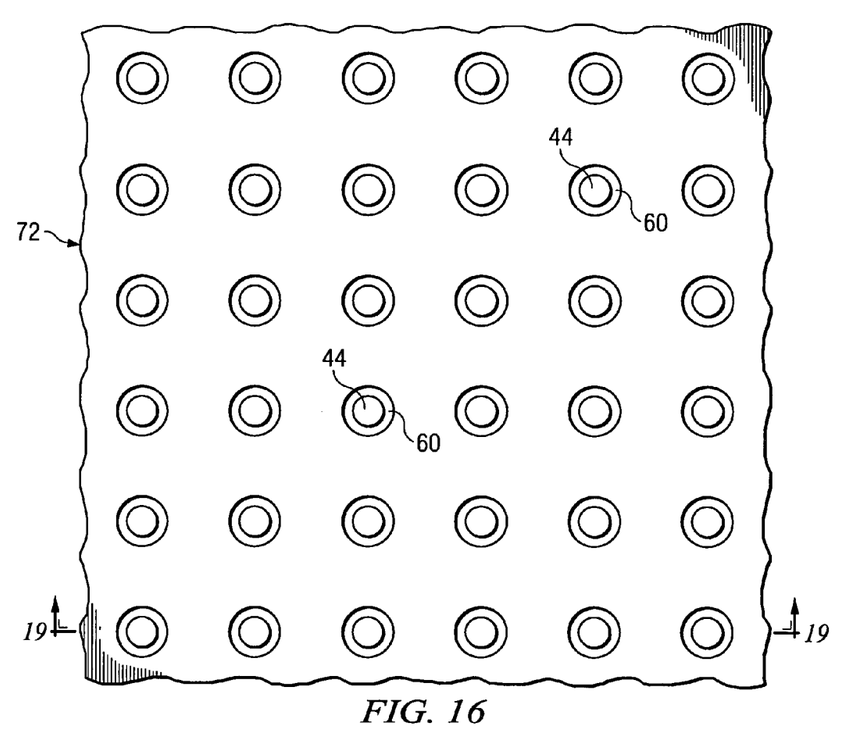
FIG. 16 shows a top view of a package substrate of a fourth embodiment of the present invention.
Figure 17:
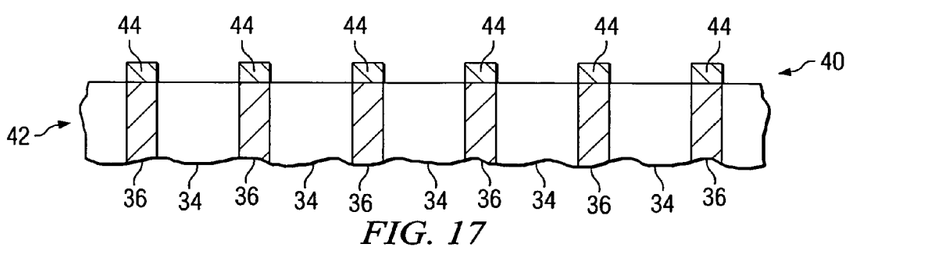
FIG. 17 shows a cross-section view of the package substrate of FIGS. 1 and 2 with a group of contact pads formed thereon.
Figure 18:
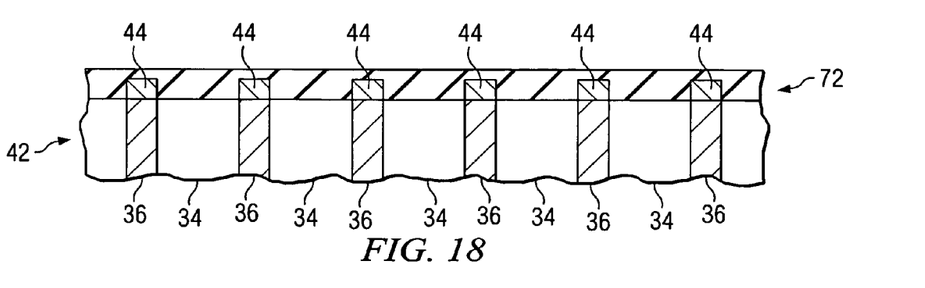
FIG. 18 shows a cross-section view of the package substrate of FIG. 17 with a second layer formed thereon.
Figure 19:
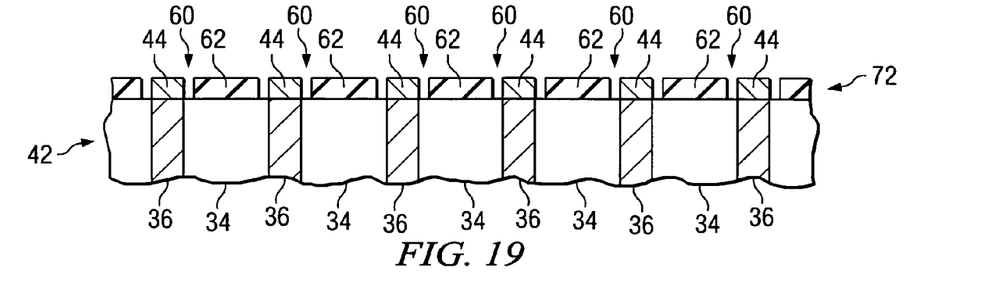
FIG. 19 shows a cross-section view of the package substrate of FIG. 18 with portions of the second layer removed above the contact pads, which is a cross-section view of the package substrate of FIG. 16 taken along line 19—19.

In a fourth embodiment of the present invention, the contact pads 44 are formed from a different material than that of the plate structure 62, as shown in FIG. 16. The fourth embodiment may be formed using the same steps of the first embodiment up to FIG. 2 (i.e., FIGS. 1 and 2). Continuing from FIG. 2, contact pads 44 are formed by removing portions of the conductive layer 40, as shown in FIG. 17. Then a second layer 72 is formed over the conductive layer 40 and the package substrate 34, as shown in FIG. 18. The second layer 72 is a different material than the conductive layer 40. Portions of the second layer 72 are then removed over the contact pads 44 to expose the contact pads 44, as shown in FIG. 19, using convention processing steps (e.g., resist, mask, develop, etch, strip). FIG. 19 is a cross-section view of FIG. 16 taken along line 19—19.

Figure 20:
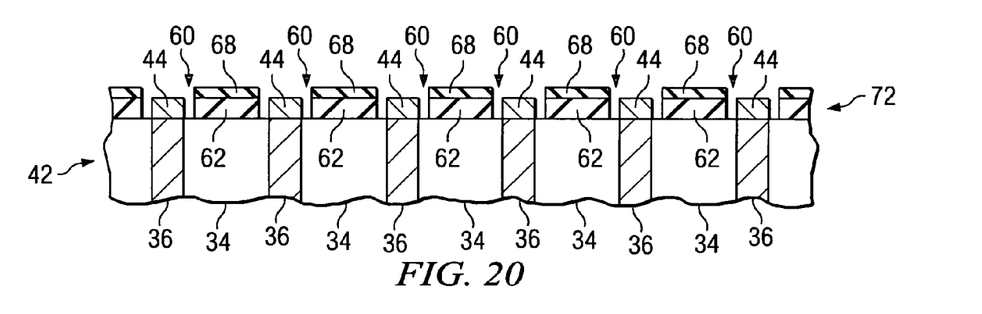
FIG. 20 shows a cross-section view of the package substrate of FIG. 19 with an oxide layer applied over the second layer.
Figure 21:
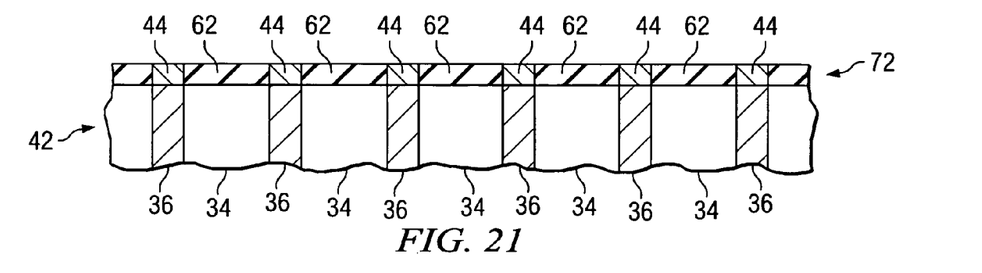
FIG. 21 shows a cross-section view of the package substrate of FIG. 18 with a top portion of the second layer removed to expose the contact pads.

The second layer 72 may be formed from a variety of possible materials, including but not limited to: metal compound, copper, aluminum, nickel, gold, silver, or polymer, for example. Preferably, the second layer 72 is formed from a material that may be deposited uniformly at a minimum thickness less than that of typical solder mask material and/or about equal to the thickness of the conductive layer 40. Also, the second layer 72 preferably has comparable or better structural rigidity, strength, and/or coefficient of thermal expansion as that of the conductive layer 40. The second layer 72 may be a conductive, semiconductive, or dielectric material. If the second layer 72 is conductive, an oxide layer 68 may be needed over the second layer 72 as shown in FIG. 20, but not over the contact pads 44 (as described above regarding the second embodiment shown in FIG. 12). As another variation on the fourth embodiment, instead of masking and etching the second layer 72 to expose the contact pads 44, the second layer may be chemically, mechanically, and/or abrasively reduced in thickness (e.g., chemical-mechanical polishing) until the contact pads 44 are exposed, as shown in FIG. 21.

It will be appreciated by those skilled in the art having the benefit of this disclosure that an embodiment of the present invention provides an improved package structure for a semiconductor device and methods of making the improved structure. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A semiconductor device, comprising:
    a package substrate having a top layer, the top layer having a group of conductive vias formed therethrough;
    a layer of conductive material disposed on the top layer of the package substrate, said conductive material including contact pads and a plate layer spaced from the contact pads and having a thickness substantially equal to the thickness of the contact pads;
    a group of channels disposed in the conductive material layer about at least some of the vias to define said contact pads on the vias;
    a semiconductor device electrically coupled to the package substrate through the contact pads; and
    an electrically insulating underfill layer disposed over said plate layer and surrounding said conductive pads and filling the region between said semiconductor device and said package substrate.

2. The semiconductor device of claim 1, wherein the conductive layer comprises a metal selected from a group consisting of copper, aluminum, nickel, gold, and silver.

3. The semiconductor device of claim 1, wherein the conductive vias comprise a metal selected from a group consisting of copper, aluminum, nickel, gold, and silver.

4. The semiconductor device of claim 1, further comprising an oxide layer disposed over the conductive layer, with portions of the oxide layer removed on at least some of the contact pads.

5. The semiconductor device of claim 4, further comprising solder balls soldered on at least some of the contact pads, the semiconductor device electrically coupled to the contact pads on the package substrate via the solder balls.

6. The semiconductor device of claim 4 wherein the oxide layer is a finite amount up to about 1 micron.

7. The semiconductor device of claim 4 wherein the oxide layer is an oxide of the conductive material.

8. The semiconductor device of claim 1, further comprising solder balls soldered on at least some of the contact pads, electrically coupled to the contact pads on the package substrate.

9. The semiconductor device of claim 1 wherein the thickness of the contact pad is substantially the same as the thickness of the remaining portion of the conductive material layer outside of the channel.

10. A package for an integrated circuit device, comprising:
    a package substrate;
    an electrically conductive layer on a surface of said package substrate having conductive pads and a layer of substantially the same thickness as said conductive pads surrounding said conductive pads;
    a semiconductor device having regions containing solder aligned with said contact pads and contacting said regions containing solder with said contact pads; and
    an electrically insulating underfill layer disposed over said plate layer and surrounding said conductive pads and filling the region between said semiconductor device and said package substrate.

11. The semiconductor device of claim 10 wherein said pads are formed of a material different from said layer of substantially the same thickness as said conductive layer.

* * * * *